United States Patent

Verelst et al.

[15] 3,652,274

[45] Mar. 28, 1972

[54] PHOTOGRAPHIC ETCHING RESIST AND PREPARATION THEREOF

[72] Inventors: Johan Lodewijk Verelst, Kontich; Jozef Frans Willems, Wilrijk, both of Belgium

[73] Assignee: Gevaert AGFA N.V., Mortsel, Belgium

[22] Filed: June 10, 1968

[21] Appl. No.: 735,582

[30] Foreign Application Priority Data

June 9, 1967 Great Britain ......................26,860/67

[52] U.S. Cl. ....................................96/36.3, 96/35.1, 96/36, 156/13

[51] Int. Cl. ........................................G03c 5/00, G03f 7/00

[58] Field of Search .......................96/35.1, 36, 36.3; 156/13

[56] References Cited

UNITED STATES PATENTS

| | | | |
|---|---|---|---|
| 2,532,390 | 12/1950 | Bennett et al | 96/36.3 |
| 2,830,899 | 4/1958 | Brown | 96/36.3 X |
| 3,147,116 | 9/1964 | Roth | 96/36.3 X |
| 3,390,992 | 7/1968 | Valles | 96/36 X |
| 3,405,017 | 10/1968 | Gee | 96/35 X |

*Primary Examiner*—David Klein
*Attorney*—William J. Daniel

[57] ABSTRACT

A printing plate of the type which is prepared by coating a metal supporting surface with a photo-insolubilizable polymer, exposing the coating to a light image, developing the exposed coating by treatment with a liquid dissolving the unexposed areas only of the coating so that the exposed areas remain as a resist layer on the metal surface, and etching the metal surface with the resist layer thereon by means of an aqueous etching liquid therefore, is given increased resistance in the exposed regions to the attack of the etching liquid by incorporating into the developing liquid a hydrophobizing agent which is either an organic compound containing at least one fluorine substituted alkyl group of an organic silane or siloxane compound containing at least one alkyl or aryl group linked to at least one of its silicon atoms, the hydrophobizing agent also containing a reactive group capable of chemically reacting with the photo-insolubilizable polymer. The polymer preferably includes active hydrogen atoms after insolubilization and preferred chemically active groups in the hydrophobizing agent are acid anhydride, isocyanate, epoxy, and acid chloride groups.

1 Claims, No Drawings

PHOTOGRAPHIC ETCHING RESIST AND PREPARATION THEREOF

This invention relates to improved photographic etching resists and to a process for the preparation thereof. More particularly the invention relates to a method, by which a photoresist acquires an improved resistance to an etching solution used in the preparation of printing plates, etched circuits, stamps and other relief forms prepared by etching.

Basically, the production of a photo-resist includes the steps of coating a surface with a photo-sensitive composition, image-wise or record-wise exposing the coating to actinic electromagnetic radiation, thereby effecting an increase or decrease in solubility in a processing liquid of the exposed portions of the coating and treating the coating with a suitable processing liquid in order to selectively remove the exposed or unexposed portions of the coating.

For preparing printing plates, metal plates on which a photo-resist has been formed, are etched. However, this method requires precautionary measures to reduce loss of adherence of the resist image while the plate is being etched.

Indeed, some polymer systems commonly used for preparing a photo-resist have too strong an affinity for water to remain unaffected by an aqueous etching treatment. Indeed, without strong hydrophobization a screened resist image containing such polymers rapidly manifests a loss of adherence of the finer resist dots, to the base, and makes the plate quite useless for printing. Therefore, it has been desirable to make printing plates not suffering from the above imperfections.

So, it is an object of the present invention to provide a remedy for the harmful effect of an aqueous etching solution on the adhesion of the resist to the base of the printing plate, and to provide the possibility of an increased application of hydrophilic and less hydrophobic resist-systems to the preparation of printing plates by aqueous etching of the base.

It is more particularly an object of the present invention to prepare printing plates, which as a result of the inhibition of degradation and loss of the fine dots of a screened resist during etching, allow an improved reproduction of fine detail.

This is achieved according to the invention by the impregnation of the polymer resist before the etching step with a liquid consisting of or containing a hydrophobizing agent for the polymer resist which is able to penetrate into the polymer resist, and thereby provides an improved resistance to the action of an aqueous etching solution.

According to a preferred method of the present invention the liquid used for impregnating the polymer resist may comprise a conventional developing solution containing a hydrophobizing agent as herein described.

The hydrophobization can also be carried out using a solution containing the said hydrophobizing agent in a solvent or solvent mixture that easily penetrates into the resist, and which is separate from the developing solution. A further possibility is the use as impregnating liquid of a hydrophobizing agent in liquid state.

Preferred hydrophobizing agents used for the purpose of the present invention are selected from the group of compounds comprising (an) alkyl group(s) including (a) substituted alkyl group(s), one or more of the hydrogen atoms of said alkyl groups being substituted with one or more fluorine atoms, and compounds containing alkyl and/or aryl groups including substituted alkyl and/or aryl groups directly (as, e.g., in a silane) or indirectly (as, e.g., by oxygen in a siloxane) attached to a silicon atom.

According to a preferred embodiment the hydrophobizing agent has a chemical affinity for one or more substances, preferably the polymeric substance(s), in the polymer resist.

Indeed, a polymer resist can be protected very effectively against the damaging action of an aqueous etching solution by chemically binding a substance having a hydrophobic character to a substance present in the resist, preferably a polymeric substance.

The chemical reaction of the reactive hydrophobizing substance can take place with reactive groups which were not involved in the hardening or cross-linking reaction necessary for the resist formation.

The chemical reactive character is chosen depending on the particular composition of the polymer resist. Preference is given, however, to groups or radicals that are reactive with groups containing an active hydrogen atom.

Compounds which possess active hydrogen atoms, include those which contain hydroxyl, carboxyl, mercapto, primary and secondary amino groups, carbonamido, sulphonamido, and reactive methylene or imide groups. The quantitative determination of active hydrogen has been carried out by Zerewitinov and Tschugajew. Examples of groups that react with groups containing an active hydrogen atom include acid anhydride groups, acid chloride groups, isocyanate groups, and/or epoxy groups. The anhydride groups and acid chloride groups are preferably derived from carboxylic acid groups or oxyacid groups of sulphur and phosphorus.

In practice preference is given to groups, which are sufficiently stable in one of the processing liquids applied before the etching step.

In this respect the above-described hydrophobizing agents containing an epoxy group are particularly useful.

Very suitable chemically active hydrophobizing agents containing an epoxy group are listed in the following table.

TABLE

| Compound | Structural formula |
| --- | --- |
| 1 | 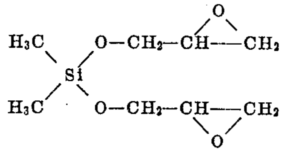 |
| 2 | 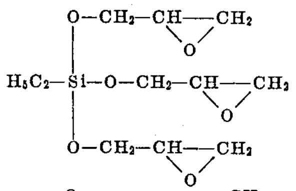 |
| 3 | 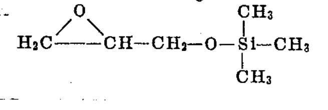 |

Table I—Continued

| Compound | Structural formula |
|---|---|
| 4 | 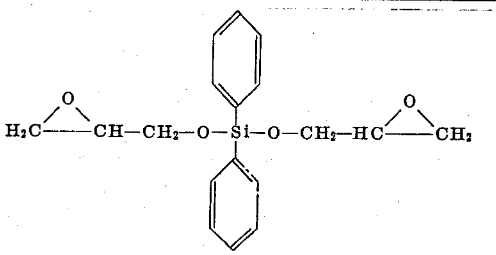 |
| 5 | 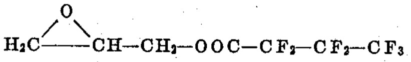 |
| 6 | 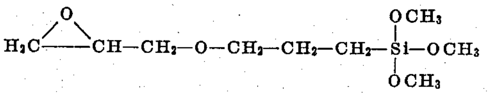 |
| 7 | 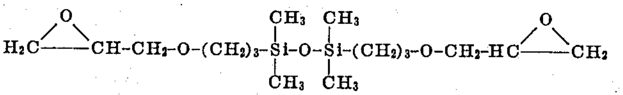 |
| 8 | 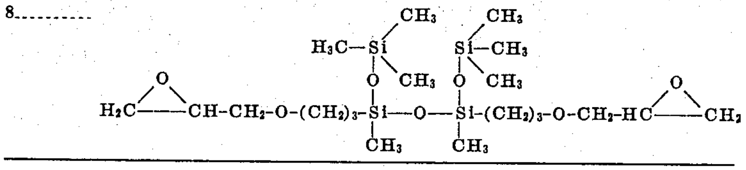 |

The preparations of the Compounds 1 to 5 and the trade name of Compounds 6, 7 and 8 are given hereinafter.

Preparation of Compound 1

A solution of 30.3 g. (0.3 mole) of triethylamine in 50 cm.$^3$ of anhydrous dioxane was added at room temperature to a solution of 22.2 g. (0.3 mole) of 2,3-epoxypropanol in 200 cm.$^3$ of anhydrous dioxane. A solution of 19.3 g. (0.15 mole) of dichlorodimethylsilane in 150 cm.$^3$ of anhydrous dioxane was then added dropwise in 30 minutes. Triethylammonium chloride precipitated immediately and after having been kept at room temperature for 2 days it was filtered with suction. The dioxane solution was concentrated by evaporation and the remaining oil was distilled in vacuo on a water bath.

Boiling point: 84° C./0.5 mm. of Hg.

Yield: 80 %.

Preparation of Compound 2

The preparation of Compound 1 was repeated, with the proviso, however, that 16.3 g. (0.1 mole) of trichloromonoethylsilane were used instead of 19.3 g. (0.15 mole) of dichlorodimethylsilane.

Boiling point: 138° C./0.5 mm. of Hg.

Yield: 80 %.

Preparation of Compound 3

The preparation of Compound 1 was repeated, with the proviso, however, that 32 g. (0.3 mole) of monochlorotrimethylsilane were used instead of 19.3 g. (0.15 mole) of dichlorodimethylsilane.

Boiling point: 140° C.

Yield: 40 %.

Preparation of Compound 4

The preparation of Compound 1 was repeated, with the proviso, however, that 29.6 g. (0.4 mole) of 2,3-epoxypropanol instead of 22.2 g. (0.3 mole) of the same compound, 40.4 g. (0.4 mole) of triethylamine instead of 30.3 g. (0.3 mole) of the same compound and 50.6 g. (0.2 mole) of dichloro-diphenylsilane instead of 19.3 g. (0.15 mole) of dichloro-dimethylsilane were used.

Boiling point: 184° C./0.4 mm. of Hg.

Yield: 60 %

Preparation of Compound 5

The preparation of Compound 1 was repeated, with the proviso, however, that 14.8 g. (0.2 mole) of 2,3-epoxypropanol instead of 22.2 g. (0.3 mole) of the same compound, 20.2 g. (0.2 mole) of triethylamine instead of 30.3 g. (0.3 mole) of the same compound and 46.4 g. (0.2 mole) of heptafluorobutyric acid chloride instead of 19.3 g. (0.15 mole) of dichloro-dimethylsilane were used.

Compound 6

This compound is marketed under the trade name "-SILANE Y 4087" by Union Carbide & Carbon, New York, N.Y., U.S.A.

Compounds 7 and 8 are respectively marketed under the trade names "SYL-KEM 90" and "DOW CORNING X2-8-5024" by Dow Corning Corp., Michigan, U.S.A. For "SYL-KEM 90" see also Chem. Prod. 22 (1959), No. 5, p. 167.

In principle the hydrophobizing agents described above can be used for any type of resist irrespective of its composition.

Considered from their chemical aspect, photographic etching resist systems can be divided into three groups. In one group a colloid or synthetic polymer is cross-linked by a compound that contains one or more photosensitive groups, which on exposure are transformed in (a) radical(s) that insolubulize(s) the surrounding binder, e.g., dichromate in gelatin or in polyvinyl alcohol, or organic polyazides in selected resins.

A second group includes those compositions, which include an organic polymeric binding material, e.g., mixed cellulose esters of monobasic or dibasic acids such as cellulose acetate succinate; an addition-polymerizable ethylenically unsaturated compound, e.g., vinylidene and vinyl monomers, preferably of the acrylic or alkacrylic ester type; e.g., triethylene glycol diacrylate; and an addition-polymerization initiator which forms radicals under the influence of actinic radiation, e.g., anthraquinone. Such compositions are described among others in the U.S. Pat. specifications Nos. 2,760,863 — 2,791,504 — 2,892,716 — 2,902,365 — 2,927,023 — 2,929,710 — 2,927,022 — 2,893,868 — 2,948,611 — 2,923,673 and 2,951,758, and in the British Pat. specifications Nos. 826,272 — 827,512 and 835,849.

The third group consists of polymers that comprise light-sensitive groups, which upon irradiation allow the polymer molecules to cross-link so that their solubility is largely reduced, e.g., polymers containing azide, carbonazide, sulphonazide or cinnamic acid ester groups, more particularly polyvinyl cinnamate, or polymers containing cinnamate ester groups linked to a polymer backbone by bivalent organic groups, e.g., urethane groups (ref. German Pat. specifications Nos. 1,063,802 and 1,063,803).

Typical metal supports for use in the preparation of printing plates for planographic printing, wherein an image-wise hydrophility-hydrophobity differentiation is produced, are so-

0426 S A BA called "bimetal" and "trimetal" metal supports, which are built up by superposed metal layers or sheets differing in wettability by water. Indeed, certain metals show a strong oleophility, e.g., copper and silver, and other metals, e.g., aluminum, chromium, and iron have a marked hydrophilic character. By image-wise etching away one of the layers in the areas not covered by a resist and finally entirely removing the protective resist, a planographic printing plate of high quality for long run planographic printing in prepared.

A typical representative of such a polymetal layer printing master blank contains a steel plate whereon a copper layer (7 to 10 $\mu$ thick) and a chromium layer (2 to 3 $\mu$ thick) with mat aspect are electrolytically deposited, which chromium layer in its turn is coated with the photosensitive coating suited for preparing the resist.

The etching of such printing plate can be carried out with an acid aqueous solution, e.g., a 12 percent hydrochbric acid solution saturated with calcium chloride (50° Be). After the etching step the resist pattern is removed by means of a suitable solvent or "stripper." The bare copper portions are oleophilic and consequently fatty ink-accepting whereas the non-etched hydrophilic chromium portions are moistened by the aqueous liquid emulsified in the ink or provided by the damping system in the planographic printing device.

The resist technique is also suited for deep etching of a metal plate, whereby relief printing plates (letterpress printing plates) as well as intaglio printing plates can be produced. In intaglio printing the whole surface of the plate is first covered with ink and wiped off with a doctor blade, leaving the cavities filled with ink. This ink is lifted out during printing operations by paper placed in contact with the printing plate.

The hydrophobizing agent is preferably used according to the invention in the developing liquid for the photo-resist. The non-resist portions of the recording layer can be selectively dissolved away or washed out by means of this developing liquid. The particular liquid used in the developing treatment depends on the composition of the polymerizable or cross-linkable material, since the liquid should not adversely affect the portions with reduced solubility. Liquids for selective dissolution of the non-resist portions can be selected from the group of aliphatic alcohols, ketones, ethers, esters, aromatic hydrocarbons, organic acids, water and aqueous solutions. Use can be made of, e.g., acetone, methyl ethyl ketone, methanol, ethanol, propanol, isopropanol, methyl acetate, ethyl acetate, methyl ether, ethyl ether, ethylene glycol monomethyl ether, ethylene glycol monoethyl ether, dioxane, glacial acetic acid, propionic acid and dilute aqueous solutions of bases such as sodium hydroxide, potassium hydroxide, and ammonium hydroxide.

The nature of the developing liquid and of the chemically active hydrophobizing substance should, of course, be such that no chemical interaction is possible between them.

In practice the polymer(s) and other substances comprised in the recording layer can be dissolved in a solvent or in a mixture of solvents that is used for applying the coating composition of the recording layer.

Removal of the soluble portions can be expedited by brushing or spraying the solvent or solvent mixture on the exposed polymeric layer.

The development may be followed by a coloring treatment to enable or facilitate the inspection of the quality of the resist.

The coloring liquid, if one is used, may contain the hydrophobizing agent, which is preferably a chemically active hydrophobizing substance.

When the hydrophobization is carried out by means of that coloring liquid containing the said hydrophobizing agent in dissolved state, said agent penetrates into the resist portions and very effectively prevents absorption of an aqueous etching liquid. As suitable solvents for applying a coloring substance which is, e.g., a triphenylmethane dye, organic liquids such as aliphatic alcohols, ketones, esters and aromatic hydrocarbons can be used.

The coloring of the resist can also occur by means of the developer containing a suitable coloring substance; operating in this way development and coloration are carried out in one step.

The chemical linking of the hydrophobizing agent with the resist substances can be accelerated or improved by supplying heat. However, the temperature should not surpass the decomposition point of the resist, nor should cause any physical changes in the substrate.

The process according to the present invention is not only suited for the preparation of printing plates, but also for preparing other metal articles wherein selected parts are removed by etching, e.g., in the preparation of printed circuits, miniature electronic circuits such as integrated circuits and semiconductor devices wherein, e.g., use is made of vacuum deposited germanium and silicon.

The following examples illustrate the present invention.

Example 1

A copper-chromium bimetal plate having a surface chromium layer of 2 $\mu$ was coated with a 4 percent solution in toluol of a light-sensitive polymer containing light-sensitive aryl sulphonylazide groups and a minor amount of hydroxyl groups attached to the polymer backbone. The dried layer had a weight of 2 g. per sq.m. Traces of solvent were removed by heating the layer for 1 hour at 80° C.

The bimetal plate coated with the indicated composition was cut in six strips each of which was exposed through a half-tone pattern containing seven fields each having a screen ruling of 70 lines/cm. From Field 1 to Field 7 the percentage of black increases as indicated in the following Table I.

TABLE I

| Field | 1 | 2 | 3 | 4 | 5 | 6 | 7 |
|---|---|---|---|---|---|---|---|
| % of black | 5 | 10 | 25 | 50 | 75 | 90 | 95 |

The exposure was a contact exposure of 6 min. carried out with an open arc lamp of 40 amps. placed at a distance of 75 cm. from each strip.

Each strip was developed for 4 min. in a developer as indicated in Table II.

After the development the screen dots were colored by dipping the strips for 1 min. in a solution of 0.2 g. of methyl violet in a mixture of ethanol/ethyl acetate 1:1. Thereupon the strips were sprayed for 30 sec. with water and finally dried.

The etching away of the chromium in the bare areas was effected within 5 min. at 20° C. by rubbing the strips with a plug of velvet soaked with an aqueous solution prepared by diluting an aqueous solution containing 12 percent by weight of hydrogen chloride and 50 percent by weight of calcium chloride to 37° Be.

The table contains the review of the resistance to the etching solution of the resist screen dots. The said resistance is expressed in the form of numbers corresponding with the fields wherein the resist screen dots still remained intact. The acid resistance of the resist is critical in the Fields 6 and 7. The resist screen dots corresponding with the Field number 5 are already large and less sensitive to the attack of the etching solution.

TABLE II

| Developer on the basis of acetone and one of the hydrophobizing substances listed herein | Last field that remained intact after etching with the 37° Be etching solution |
|---|---|
| blank (no ingredient) | 4 |
| 1% by weight of compound 1 | 7 |
| 1% by weight of compound 4 | 7 |
| 1% by weight of compound 6 | 6 |
| 1% by weight of perfluorobutyric acid | 5 |
| 1% by weight of tetraethoxysilane | 6 |

Example 2

Under the same conditions six glass plates were vacuum-coated with a chromium layer. To the chromium layer of each glass strip a 5 percent by weight solution in methylglycol acetate of polyvinyl cinnamate containing 0.1 percent by weight of Michler's ketone and having a viscosity of 4 c.p.s. was applied. The polyvinyl cinnamate contained 5 percent of free hydroxyl groups. The coating was carried out by means of a centrifuge (200 r.p.m.). After drying, the light-sensitive layer had a thickness of 0.7 $\mu$.

The exposure was the same as described in Example 1.

The exposed strips were developed for 3 min. in a developer as described in Table III.

The developed strips were sprayed for 30 sec. with water and dried.

The etching occurred with an aqueous solution containing 15 percent by weight of hydrogen chloride. In the etching bath a copper plate formed a galvanic contact with the chromium layer. The etching time was 2 min.

TABLE III

| Developer containing 75% by volume of m-xylene and 25% by volume of butyl-acetate and one of the ingredients listed herein | Last field which remained intact after etching |
|---|---|
| blank (no ingredient) | 5 |
| 2% by weight of compound 1 | 7 |
| 2% by weight of compound 4 | 7 |
| 2% by weight of compound 6 | 7 |
| 2% by weight of perfluorobutyric acid | 6 |
| 2% by weight of tetraethoxysilane | 7 |

We claim:

1. In a method of preparing a printing plate which comprises the steps of:

1. coating an etchable metal surface with a photo-insolubilizable polymeric coating which comprises a photo-insolubilizable polymer containing azide, carbonazide or sulphonylazide groups and a minor amount of hydroxyl groups or comprises a polymer containing cinnamate ester groups and a minor amount of hydroxyl groups,
2. exposing the coating to an actinic light image,
3. developing the exposed coating by removing the unexposed portions of the coating with a solvent therefor, and
4. contacting the thus exposed metal surface areas with an etching liquid for said metal, the improvement of increasing the resistance of said insolubilized polymer portions by incorporating in said solvent a hydrophobizing agent for the unsolubilized polymer, said hydrophobizing agent being an epoxy-substituted aliphatic perfluoro alkyl compound or a siloxane compound having the following general formula:

$$R-\overset{\displaystyle R}{\underset{\displaystyle R}{Si}}-O-R$$

wherein R represents an alkyl, an alkoxy, or an aryl group at least one of said groups containing an epoxy group.

* * * * *